United States Patent
James et al.

(10) Patent No.: US 7,401,180 B1
(45) Date of Patent: Jul. 15, 2008

(54) CONTENT ADDRESSABLE MEMORY (CAM) DEVICE HAVING SELECTABLE ACCESS AND METHOD THEREFOR

(75) Inventors: David V. James, Palo Alto, CA (US); Jagadeesan Rajamanickam, San Jose, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 318 days.

(21) Appl. No.: 10/264,667

(22) Filed: Oct. 4, 2002

Related U.S. Application Data (60) Provisional application No. 60/343,973, filed on Dec. 27, 2001.

(51) Int. Cl.
*G16F 12/00* (2006.01)
(52) U.S. Cl. ............... 711/108; 356/49.1; 356/49.17
(58) Field of Classification Search ............... 711/108; 356/108, 49.1, 49.17
See application file for complete search history.

(56) References Cited

U.S. PATENT DOCUMENTS

| | | | |
|---|---|---|---|
| 4,244,033 A | 1/1981 | Hattori | |
| 4,670,858 A | 6/1987 | Almy | |
| 5,485,418 A | 1/1996 | Hiraki et al. | |
| 5,517,441 A | 5/1996 | Dietz et al. | |
| 5,621,677 A | 4/1997 | Jones | |
| 5,680,504 A | 10/1997 | Kopp | |
| 5,893,137 A | 4/1999 | Parks et al. | |
| 5,920,886 A | 7/1999 | Feldmeier | |
| 5,946,704 A | 8/1999 | Yoneda et al. | |
| 5,956,336 A | 9/1999 | Loschke et al. | |
| 6,081,440 A | 6/2000 | Washburn et al. | |
| 6,108,227 A | 8/2000 | Voelkel | |
| 6,191,970 B1 | 2/2001 | Pereira | |
| 6,240,000 B1 | 5/2001 | Sywyk et al. | |
| 6,243,280 B1 | 6/2001 | Wong et al. | |
| 6,253,280 B1 | 6/2001 | Voelkel | |
| 6,266,262 B1 | 7/2001 | Washburn et al. | |
| 6,268,807 B1 * | 7/2001 | Miller et al. | ............ 341/50 |
| 6,374,325 B1 * | 4/2002 | Simpson et al. | ............ 711/108 |
| 6,430,074 B1 | 8/2002 | Srinivasan | |
| 6,467,020 B1 * | 10/2002 | Stilkol et al. | ............ 711/108 |
| 6,480,406 B1 | 11/2002 | Jin et al. | |
| 6,502,163 B1 | 12/2002 | Ramankutty | |
| 6,504,740 B1 | 1/2003 | Voelkel | |
| 6,505,270 B1 | 1/2003 | Voelkel et al. | |
| 6,515,884 B1 | 2/2003 | Sywyk et al. | |
| 6,538,911 B1 * | 3/2003 | Allan et al. | ............ 365/49 |

(Continued)

OTHER PUBLICATIONS

U.S. Appl. No. 10/281,814, James et al.

(Continued)

*Primary Examiner*—Woo H. Choi
(74) *Attorney, Agent, or Firm*—Haverstock & Owens, LLP (57) ABSTRACT

According to one embodiment, a content addressable memory (CAM) device (100) may include a number of segments (102 or 104). Search target compare circuits (110 and 112) can compare a target value TARGET to programmable information values (PIV0 and PIV1) associated with a particular segment (102 and 104). If a search target value TARGET matches a programmable information value (PIV0 and PIV1), search operations may be performed in a segment (102 or 104). If a search target value TARGET does not match a programmable information value, (PIV0 and PIV1), search operations may be prevented within a segment (102 or 104).

12 Claims, 8 Drawing Sheets

U.S. PATENT DOCUMENTS

| | | | |
|---|---|---|---|
| 6,542,391 B2 * | 4/2003 | Pereira et al. | 365/49 |
| 6,553,453 B1 * | 4/2003 | Gibson et al. | 711/108 |
| 6,647,457 B1 | 11/2003 | Sywyk et al. | |
| 6,661,716 B1 | 12/2003 | Sywyk | |
| 6,697,275 B1 | 2/2004 | Sywyk et al. | |
| 6,721,202 B1 | 4/2004 | Roge et al. | |
| 6,744,652 B2 * | 6/2004 | Srinivasan et al. | 365/49 |
| 6,751,755 B1 | 6/2004 | Sywyk et al. | |
| 6,757,779 B1 | 6/2004 | Wong et al. | |
| 6,763,426 B1 | 7/2004 | James et al. | |
| 6,772,279 B1 | 8/2004 | Sun et al. | |
| 6,804,744 B1 | 10/2004 | Abbas | |
| 6,845,024 B1 | 1/2005 | Wanzakhade et al. | |
| 6,876,558 B1 | 4/2005 | James et al. | |
| 6,892,273 B1 | 5/2005 | James et al. | |
| 6,910,097 B1 | 6/2005 | Srinivasan et al. | |

OTHER PUBLICATIONS

U.S. Appl. No. 10/271,660, James, David.
U.S. Appl. No. 10/320,049, James, David.
U.S. Appl. No. 10/286,198, James, David.
U.S. Appl. No. 10/286,199, Rajamanickam, Jagad.
U.S. Appl. No. 10/281,814, James, David.
U.S. Appl. No. 10/264,668, Rajamanickam, Jagad.
U.S. Appl. No. 10/329,146, James, David.
U.S. Appl. No. 10/266,953, Wanzakhade, Sanjay.
U.S. Appl. No. 10/320,588, Wanzakhade, Sanjay.
U.S. Appl. No. 10/320,053, Wanzakhade, Sanjay.
U.S. Appl. No. 10/202,526, Zou, Janet.
U.S. Appl. No. 10/873,608, Meng, Anita X.
U.S. Appl. No. 10/746,899, Om, Hari.
U.S. Appl. No. 11/000,568, Smith, Scott.
U.S. Appl. No. 11/011,464, Smith, Scott.
U.S. Appl. No. 10/897,062, Venkatachary, Sriniv.
U.S. Appl. No. 10/940,129, Narum, Steven.
U.S. Appl. No. 10/950,323, Birman, Mark.
U.S. Appl. No. 10/977,516, Om, Hari.
U.S. Appl. No. 11/014,123, Om, Hari.
U.S. Appl. No. 11/043,391, Gupta, Pankaj.
U.S. Appl. No. 60/612,905, Venkatachary, Sriniv.
U.S. Appl. No. 60/663,656, Maheshwari, Dinesh.
U.S. Appl. No. 60/661,745, Maheshwari, Dinesh.
U.S. Appl. No. 60/657,754, Maheshwari, Dinesh.
U.S. Appl. No. 60/629,694, Jiang, Bin.
U.S. Appl. No. 60/666,875, Maheshwari, Dinesh.
U.S. Appl. No. 11/085,399, Om, Hari.
U.S. Appl. No. 11/089,837, Smith, Scott.
U.S. Appl. No. 60/667,325, Om, Hari.
U.S. Appl. No. 10/217,746, Chou, Richard.
U.S. Appl. No. 11/090,116, Banachowicz, Bartosz.

* cited by examiner

CONTENT ADDRESSABLE MEMORY (CAM) DEVICE HAVING SELECTABLE ACCESS AND METHOD THEREFOR

This application claims the benefit of provisional application Ser. No. 60/343,973 filed Dec. 27, 2001.

TECHNICAL FIELD

The present invention relates to semiconductor memory devices, and more particularly to content addressable memory (CAM) devices.

BACKGROUND OF THE INVENTION

Content addressable memory (CAM) devices enjoy a wide variety of applications, including conventional search engine systems. A search engine system can typically include one or more search engine devices. A search engine device can include circuitry for performing one or more types of search operations. In a search operation, a comparand (or key) may be compared to multiple entries to see if all or a portion of the key matches an entry. After a search operation, a search engine may give a search result as an output. Typically a search result may include an "index" value, which may be used to access associated data or may include associated data itself.

A CAM device, can be a preferred type of search engine system device. CAM devices can be capable of executing search operations faster than many other conventional approaches, such as those based in general purpose processors executing a search algorithm. CAM devices are typically based on particular types of CAM cells. Such CAM cells may include storage circuits integrated with compare circuits. Storage circuits may include, without limitation, storage circuits based on static random access memory (SRAM) type cells or dynamic random access memory (DRAM) type cells. Alternate approaches may include random access memories (RAM) arrays, or the like, with separate matching circuits and/or processes.

As with most integrated circuit devices, a desirable feature in a CAM device can be a rate at which compare operations can be executed. In many cases, an overall rate at which a conventional CAM device can generate results can be related to a number of entries that have to be searched.

In addition, power consumption is almost always an important factor for any integrated circuit. Lower power consumption in a device can allow for smaller power supplies and peak current requirements for a device and/or system.

A CAM may perform a search function described above by applying a search key or "comparand" to a table of stored data values. A CAM may then determine if any of the data values matches a given search key. A typical conventional search operation, along with a general architecture of a conventional CAM system will now be described in more detail.

Figure 10:
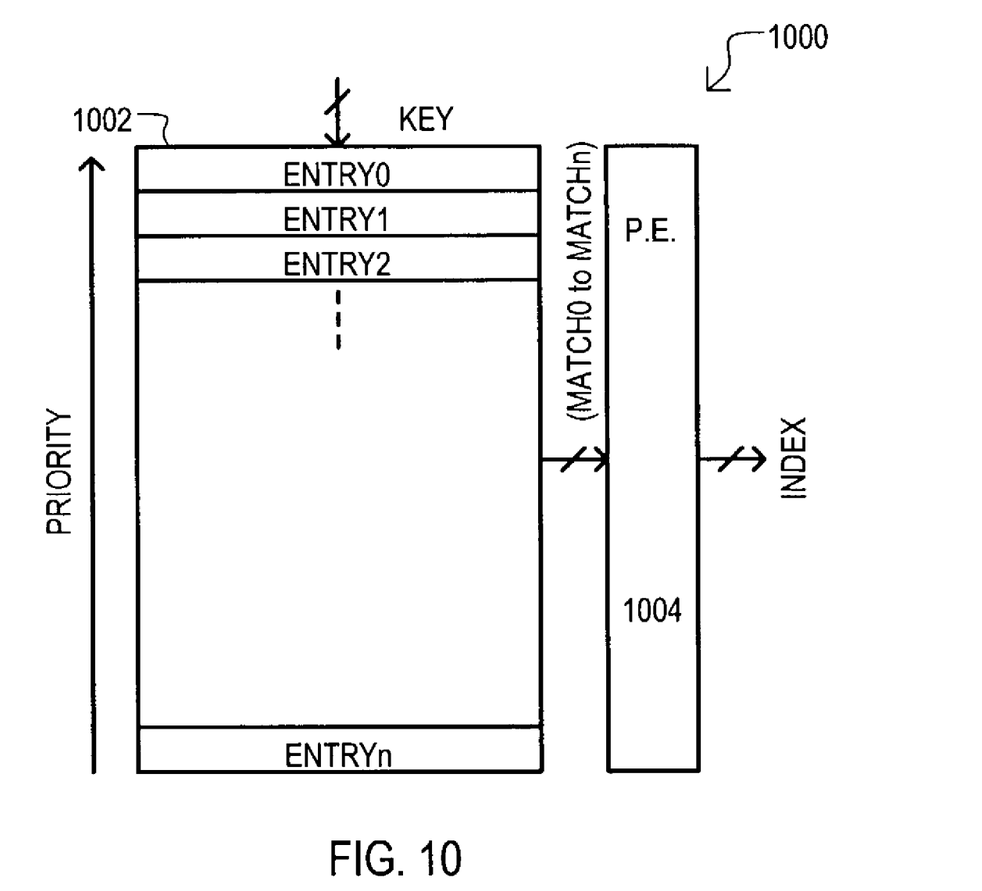
FIG. 10 is a block diagram of a conventional CAM device.

Referring now to FIG. 10, a conventional CAM device is set forth in a block diagram and designated by the general reference character 1000. A conventional CAM device 1000 may include a number of entries (ENTRY0 to ENTRYn) 1002 and a priority encoder 1004. Each entry (ENTRY0 to ENTRYn) may store a data value for comparison with an applied key value KEY. In a conventional compare operation, a key value KEY can be applied to entries (ENTRY0 to ENTRYn) essentially simultaneously. That is, a key value KEY can be applied to all entries (ENTRY0 to ENTRYn).

Each entry (ENTRY0 to ENTRYn) can generate a corresponding match indication (MATCH0 to MATCHn) that can reflect whether or not data for an entry matches an applied key value. More particularly, if entry data matches a key value, a corresponding match indication can be active. If entry data does not match a key value, a corresponding match indication can be inactive.

Priority from among multiple active match indications can be established by a priority encoder 1004. More particularly, a conventional priority encoder 1004 can prioritizes match indication according to a "physical" priority of the entries. A physical priority can be a priority established by a physical location of an entry on a conventional CAM device. Typically, physical priority can correspond to an address of an entry, with lower address values having priority over higher address values.

In the example of FIG. 10, a priority encoder 1004 can encode a highest priority match indication into an index value INDEX. In some conventional approaches, an index value can be used to access associated data, or alternative, a highest priority match indication can access associated data directly.

In a conventional approach, some entries may be considered "invalid" and thus may be excluded from generating a match indication. Conventionally, invalid entries can be distinguished from valid entries by a valid bit. That is, valid entries may have a valid bit set to one value (e.g., 1), while invalid entries may have a valid bit set to another value (e.g., 0). In a conventional compare operation, a valid bit value of "1" may be applied in combination with a key, thus forcing invalid entries to "not match" a key value. However, a key value can still be applied to such invalid entries.

A drawback to conventional approaches can be limited flexibility in how data may be stored within CAM entries. As shown in FIG. 10, a typical conventional CAM can include entries accessible by a single addressable space that establishes a hard priority. If a large number of new data values needs to be entered, such data values have to be inserted at an appropriate address, and all lower priority values will have to be shifted to lower priority locations.

In light of the above, it would be desirable to arrive at a CAM device that can provide greater flexibility in the manner in which data may be stored in CAM entries.

In addition, or alternatively it would be desirable to arrive at CAM device that may provide search result values at a faster rate than conventional approaches.

Still further, it would be desirable to arrive at CAM device that may consume less power than conventional CAM devices.

SUMMARY OF THE INVENTION

According to the present invention a content addressable memory (CAM) device can include a programmable information (PI) value store. A PI value store can store a number of PI values, each PI value being associated with a different collection of CAM entries. Further, each PI value can enable operations for the associated collection of CAM entries.

According to one aspect of the embodiments, a PI value store can include a number of register entries, each register entry storing a PI value. In particular arrangements, each register entry can be accessed according to a predetermined register address.

According to another aspect of the embodiments, a CAM device may include a data bus coupled to the PI value store. A data bus can receive PI values.

According to another aspect of the embodiments, a CAM device can include a compare circuit that compares a search target value to PI values. In particular arrangements, a compare circuit can include a number of comparators. Each comparator can correspond to at least one PI value, and have a first input that receives a search target value and a second input that receives one or more PI values.

According to another aspect of the embodiments, collections of CAM entries can be commonly coupled to a key bus. A key bus can provide a key value for comparison to data values stored in the collection of CAM entries.

According to another aspect of the embodiments, a CAM device may include a number of search circuits. Search circuits can be associated with a collection of CAM entries and can be disabled in response to a comparison between one or more PI values and a target value. Each search circuit can be selected from a group of possible circuits. The group of possible circuits can include a gate that can allow a key to be applied to the collection of CAM entries, a precharge circuit that can precharge match lines associated with the collection of CAM entries, and a priority encoder circuit that can prioritize match indications associated with the collection of CAM entries.

According to another aspect of the embodiments, a CAM device may include a global key store. A global key store may store at least one global key value. A global key value can enable access to all collections of CAM entries in a CAM device.

The present invention may also include a method of searching a CAM device. Such a method can include enabling a search of at least one portion of a CAM cell array if a PI value matches a target value. A PI value can be associated with the at least one portion of a CAM cell array. A target value can be supplied with a search command.

According to one aspect of the embodiments, a method may also include enabling a search of all portions of the CAM cell array if a global key value matches the target value. Such an enabling can be regardless of matches between PI values and the target value. In one particular approach, enabling all portions of a CAM cell array can include comparing a global key value with a target value.

According to another aspect of the embodiments, a method can include comparing a number of PI values to a target value.

According to another aspect of the embodiments, a method can also include receiving a search command and an associated target value. In one particular approach, a method may further include decoding a search command.

According to another aspect of the embodiments, a method can include disabling a search of at least one portion of a CAM cell array if a PI value associated with the at least one portion of the CAM cell array does not match a target value. In very particular approaches, disabling a search of at least a portion of the CAM array can include preventing a charging and/or discharging of selected portions of circuits associated with the at least one portion of the CAM array.

The present invention may also be directed to a content addressable memory (CAM) that includes programmable identification values (PIVs), each PIV being associated with a designated segment of a CAM.

Still further, the present invention can include a method of restricting a search space of a CAM. Such a method can include comparing a command associated PIV to a programmed PIV associated with a designated segment of the CAM. A search key match function can be enabled or disabled based on a PIV comparison result.

The present invention may also include a method of reducing the power consumption in a CAM. Such a method can include comparing a command associated PIV to a programmed PIV associated with a designated segment of the CAM. The method can also include entering a reduced power mode within the designated segment of the CAM based on the PIV comparison result.

DETAILED DESCRIPTION OF THE EMBODIMENTS

Various embodiments of the present invention will now be described in conjunction with a number of figures. The embodiments set forth examples of CAM devices and methods for selectively accessing portions of a CAM device based on programmable information (PI) values. Devices employing programmable information values as described herein may bear the trademark MINIKEY, which is the property of Cypress Semiconductor Corporation, of San Jose, Calif.

Figure 1:
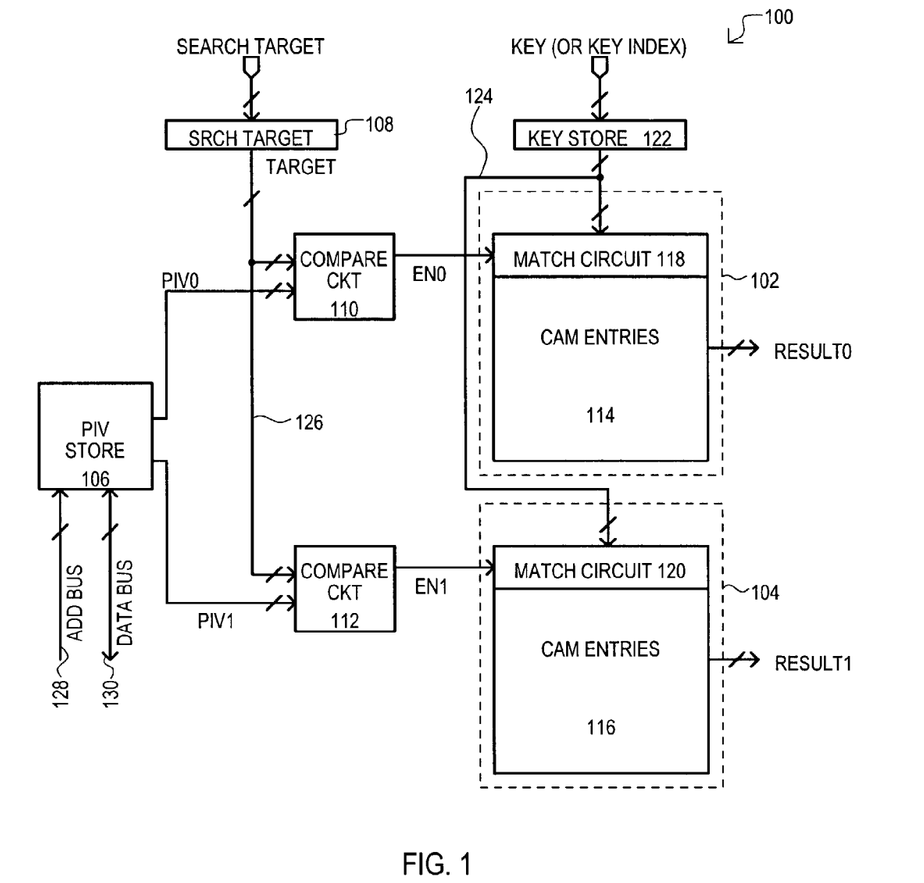
FIG. 1 is a block diagram of a content addressable memory (CAM) device according to a first embodiment of the present invention.

Referring now to FIG. 1, a CAM device according to a first embodiment is set forth and designated by the general reference number 100. A CAM device 100 may include a number of CAM entries, each of which may store data values for comparison with a key value. Unlike conventional approaches, CAM entries may be logically divided into different segments that may be selectively accessed according to an associated PI value. Such a logical separation of CAM entries is shown in FIG. 1 by two segments 102 or 104, each of which includes a number of CAM entries.

It is understood that CAM entries may take a variety of forms. For example, an entry may store a data value and be capable of generating a result that compares such a data value to a key value. Match circuits can include circuits that compare a data value to a key value, may be separate from, or intermixed with, data storing circuits. Preferably, each entry can have the latter arrangement. Even more preferably, each entry may include a number of CAM cells coupled to a match line that can provide a maskable bitwise comparison between a data value and key value.

Entries common to a segment 102 or 104 may include a number of sequentially accessible entries (e.g., entries of a particular address range). In addition or alternatively, entries of a segment 102 or 104 may include a number of entries that may be commonly accessed and/or controlled.

A CAM device 100 may further include a PI store 106, a search target store 108, and search target compare circuits 110 and 112. FIG. 1 also identifies CAM entries 114 for segment 102 and CAM entries 116 for segment 104. FIG. 1 includes match circuits 118 for segment 102 and a match circuit 120 for segment 104. However, as noted above, it is understood that match circuits 118 may be circuits integral to entries 114. Similarly, match circuits 120 may be integral to entries 116.

It is understood that a segment 102 or 104 can represent a division of CAM entries in a CAM device at one particular level. For example, a segment 102 or 104 may be one of a number of "blocks" on a CAM device 100. Alternatively, a segment 102 or 104 may represent a "sub-block," where multiple sub-blocks may form a block. Thus, while FIG. 1 is provided to illustrate selectable access to different portions of a CAM device, such selectable access may be repeated at a higher level (e.g., segments 102 and 104 can belong to a same block that is selectable from multiple such blocks) and/or repeated at a lower level (e.g., segments 102 and 104 can be blocks that are further divisible into sub-blocks, where each sub-block can be separately selected).

CAM entries (114 and 116) can generate search results (RESULT0 to RESULT1) in response to a search operation. As but two of the many possible examples, search results (RESULT0 to RESULT1) may include a number of match indications, that each correspond to an entry or an index value that corresponds to a highest priority matching entry from among all matching entries of a segment (102 or 104).

A CAM device 100 according to the embodiment of FIG. 1 can further include a key store 122. A key store 122 may store a key value (comparand). Such a key value can be supplied to multiple segments (102 and 104) in a CAM device 100 by way of a key input bus 124. A key store 122 can provide key values in a number of ways. As but two examples, key store 122 may receive a key value directly, by way of a key value accompanying a search command, or the like. In addition or alternatively, a key store 122 may store a number of key values, one of which may be accessed by a key index value, or the like.

Referring still to FIG. 1, a search target store 108 may store a search target value. A search target value TARGET may correspond to a search command to thereby indicate selective (or non-selective) searching of CAM device segments. Preferably, search target values can include "directed" target values, which are intended to search entries (114 and 116) of some, but not all segments (102 and 104), and "global" target values which are intended to search all entries (114 and 116) of a CAM device 100 without regard to any particular segment.

As but one very particular example, a target value TARGET can include a number of bits. Some bit combinations can be predetermined directed target values, while one or more other selected combinations can be predetermined global target values.

As shown in FIG. 1, a search target value TARGET can be supplied to search target compare circuits (110 and 112) by way of a target bus 126.

In addition to receiving a target value TARGET, each search target compare circuit (110 and 112) may also receive a PI value (PIV0 and PIV1) associated with a particular segment (102 and 104). PI values (PIV0 and PIV1) may be provided by a PIV store 106. A PIV store 106 may store at least one PI value for each segment (102 and 104) of a CAM device 100.

In FIG. 1, a PIV store 106 may provide PI value PIV0 to compare circuit 110 and PI value PIV1 to compare circuit 112. Further, values provided by a PIV store 106 may be programmable, and thus can be accessible by a person/device external to a CAM device 100. In the particular example of FIG. 1, a PIV store 106 is accessible by an address bus 128 and data bus 130. Still further, PI values (PIV0 and PIV1) may have default values that can be established upon a predetermined condition. Such conditions may include when power is first applied to a CAM device, when a CAM device is reset, and/or in response to a particular command or combination of input values, to name but a few of the many possible conditions.

In one particular arrangement, a PIV store 106 may include a number of registers within a group of programmable information registers for a CAM device.

As noted above, each PI value can be associated with at least one segment 102 or 104 in a CAM device. In one particular arrangement, a PI value may correspond to a segment that includes sequentially arranged entries. In addition, or alternatively, a PI value may correspond to a segment that includes a number of entries that may be commonly accessed and/or controlled.

Each search target compare circuit 110 or 112 can be associated with the entries of at least one segment (102 and 104). In the particular case of FIG. 1, search target compare circuit 110 can be associated with CAM entries 114, while search target compare circuit 112 can be associated with CAM entries 116.

A search target compare circuit (110 or 112) may compare all, or a portion of a search target value TARGET to all or a portion of an associated PI value (PIV0 or PIV1). Depending upon whether a match exists, a search target compare circuit 110 or 112 can provide an active or inactive enable indication EN0 or EN1. An enable indication EN0 or EN1 can enable or disable "access" to entries of an associated segment (102 or 104).

As but a few of the many possible examples, enabling access to entries of a segment can enable a search operation for such entries, read operation from such entries, and/or a write operation to such entries. Disabling access to entries of a segment can disable such operations for such segments. Various examples of approaches to enabling/disabling access to entries will be described at a later point herein.

Of course, it is understood that while particular buses are shown as separate entities in FIG. 1, such entities may be a same bus. As but one example, a search target value for a search target store 108 and/or a key value for key store 122 may be received on a same bus as data bus 130. Further, an address bus and data bus (128 and 130) may be a same data bus in a multiplexed bus arrangement.

PI values may be programmable (e.g., by a user, or process, preset operation) and can identify an associated segment of a CAM device. Further, a target value may be considered a command associated PI value, as it may be associated with a command, such as a search or the like.

An operation of a first embodiment will now be briefly described. A CAM device 100 may initially be programmed with PI values. For example, PI values of PIV0=4 and PIV1=0 may be written into PIV store 106. Such values (PIV0=4 and PIV1=0) may then be supplied to compare circuits (110 and 112, respectively).

A CAM device 100 may then receive a search command with an associated key value and search target value TARGET. For this example, it will be assumed that a search target value is TARGET=4. A search target value TARGET may be stored in a search target store 108, which may provide such a value to compare circuits (110 and 112).

Compare circuit 110 can compare a value PIV0=4 to a search target value TARGET=4. Because a match exists, a compare circuit 110 can activate an enable indication EN0. Because enable indication EN0 is active, access to CAM entries 114 can be enabled. Because a search operation is indicated, an active enable indication EN0 can enable a key value to be applied to segment 102, thus performing a search limited to CAM entries 114.

In contrast, compare circuit 112 can compare a value PIV1=0 to a search target value TARGET=4. Because a match does not exist, a compare circuit 112 can provide an inactivate enable indication EN1. Because enable indication EN1 is inactive, access to CAM entries 116 can be disabled. Because a search operation is indicated, an inactive enable indication EN1 can prevent a search operation within segment 104, thus preventing a search of CAM entries 116.

Of course, other operations naturally follow from the above description. For example, a CAM device 100 may receive a read or write command, in which case a comparison of a target value and PI value can either allow or prevent such a read or write operation from taking place.

In this way, a CAM may have selectable access. Such selectable access may result in faster search results or other operations, in the event particular segments can be precluded from such operations. Further, such selectable access may result in lower power consumption as entire segments within a CAM device may be disabled, and thus not necessarily draw additional power as compared to enabled segments.

Figure 2:
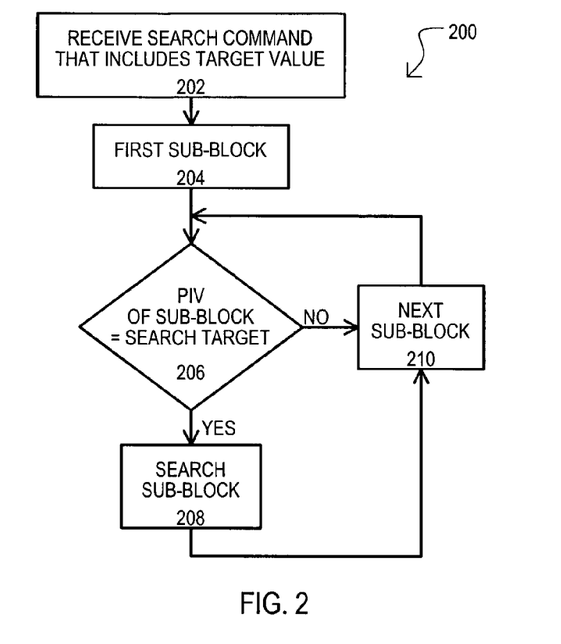
FIG. 2 is a flow diagram showing a search operation for a CAM device according to one embodiment of the present invention.

Referring now to FIG. 2, a flow diagram of a search operation according to one embodiment is set forth and designated by the general reference number 200. In FIG. 2, it is assumed that entries of a CAM device are logically arranged into multiple "sub-blocks." For example, sub-blocks in FIG. 2 can correspond to groups of entries of a segment in FIG. 1.

A search operation 200 may include receiving a search command that includes a search target value (step 202). A step 202 may include a CAM device 200 receiving a data field or set of signals that indicates a search operation is to be performed, a key value that may be used in a search, and a search target value that may enable selectable access to portions of a CAM device. Such data/signals may be received at the same time or different times.

In the particular search operation 200 of FIG. 2, a determination can be made for a first sub-block (step 204). Thus, for a first sub-block, a PI value (PIV) corresponding to a sub-block can be compared to a search target (step 206). Such a step may include comparing all or a predetermined portion of a PI value for a sub-block with a search target value.

In FIG. 2, if such a comparison indicates a match, entries of a sub-block may be searched (step 208). A step 208 can include applying a key value to data stored in a number of entries, and determining if any entries match a key value.

If a search target value does not match a PI value, a search operation may repeat a step 206 in a next sub-block of a CAM device (step 210).

It is understood that steps set forth in a method 200 should not be construed as being limited to a particular order. As but one example, PIVs for multiple sub-blocks may be compared to a search target value essentially simultaneously.

Figure 3:
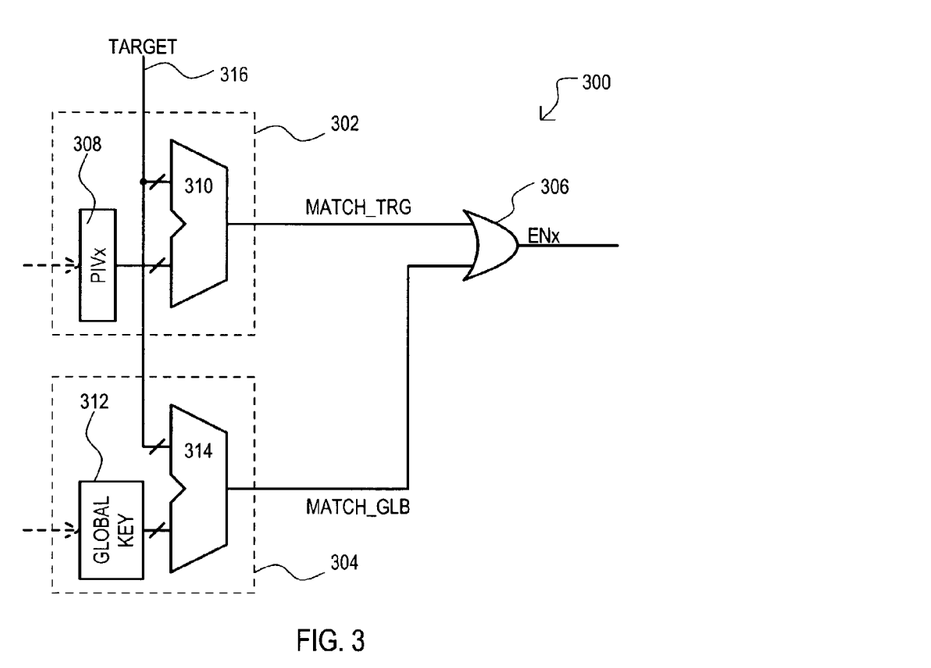
FIG. 3 is a block schematic diagram of a search target compare circuit according to an embodiment of the present invention.

Referring now to FIG. 3, one example of a search target compare circuit according to an embodiment is set forth in a block schematic diagram and designated by the general reference character 300. A search target compare circuit 300 may include one or more PI comparators 302, one or more global key comparators 304, and a gate circuit 306.

A PI comparator 302 may include a PIV store 308 and a first comparator circuit 310. A PIV store 308 may store a PI value. In one particular arrangement, a PI value may correspond to a predetermined collection of CAM entries, such as a segment, block and/or sub-block as noted above. A PIV store 308 may be a latch, or the like, that can provide a stable PI value to a comparator circuit 310.

A first comparator circuit 310 may receive a search target value TARGET at a target input 316 and a PI value from PIV store 314 at another input and compare such values to one another. According to such a comparison, a first comparator circuit 310 can activate or de-activate a target match indication MATCH_TRG. In the particular example of FIG. 3, a first comparator circuit 310 may drive a target match indication MATCH_TRG high if input values match one another, or drive a target match indication MATCH_TRG low if input values do not match one another.

In this way, one or more signals MATCH_TRG may be generated that can indicate when a search target value TARGET matches a programmable PI value PIVx.

A global key comparator 304 may include similar constituents to a PI comparator 302, including a global key store 312 and a second comparator circuit 314. A global key store 312 may store a global key value. A global key value can be a predetermined value corresponding to a search operation in multiple collections of CAM entries, such as a segments, blocks and/or sub-blocks, as noted above. A global key store 312, like a PI store 308, may be a latch or the like, that can provide a stable global key value to a second comparator circuit 314.

A second comparator circuit 314 may receive a search target value TARGET at one input, and a global key value from global key store 312 at another input and compare such values to one another. Like first comparator circuit 310, a second comparator circuit 314 can activate or de-activate a global match indication MATCH_GLB. In the particular example of FIG. 3, a second comparator circuit 314 may drive a global match indication MATCH_GLB high if input values match one another, or drive a global match indication MATCH_GLB low if input values do not match one another.

In this way, one or more signals MATCH_GLB may be generated that can indicate when a search target value TARGET matches a global key value, and that can indicate a non-selectable match operation.

A gate circuit 306 may include a logic circuit, or the like, that can logically combine signals provided from a PI comparator 302 and a global key comparator 304. In the particular case of FIG. 3, gate circuit 306 may include a logic OR gate that provides an output signal ENx that can be generated by logically ORing a search target match indication MATCH_TRG and a global target match indication MATCH_GLB.

In this way, one or more signals ENx may be generated that can indicate when a search target value TARGET matches either a PI value or a global key value.

It is understood that while FIG. 3 shows a search target compare circuit with one PI comparator 302, a CAM device according to the present invention may include arrangements in which multiple PI values may be associated with a single collection of entries (e.g., segment, block and/or sub-block). Thus, a PI comparator can include comparator circuits for comparing a search target value to multiple PI values. In a similar fashion, a global key comparator 304 can compare a search target value to multiple global key values.

It is also understood that while a CAM device may include multiple PI comparators (like 302 of FIG. 3), each corresponding to a particular collection of CAM entries, a CAM device may include as few as one global key comparator (like 304 of FIG. 3) that can provide a global key match indication to multiple logic gates (like 306 of FIG. 3).

Figure 4A:
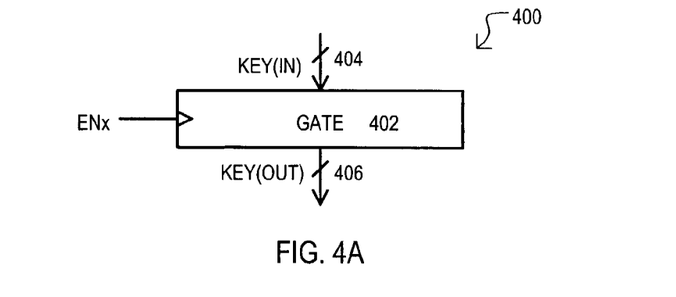
FIGS. 4A-4C show examples of match circuit portions that can be disabled according to various embodiments of the present invention.
Figure 4B:
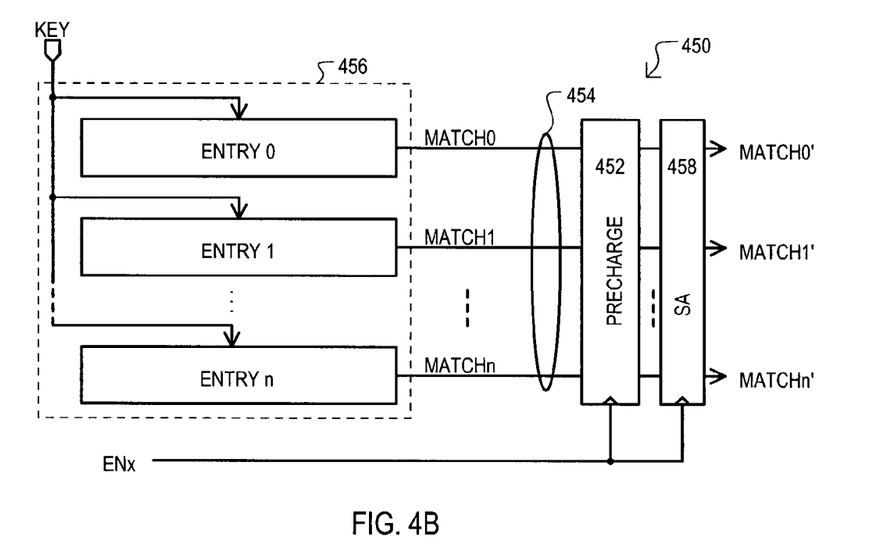
Figure 4C:
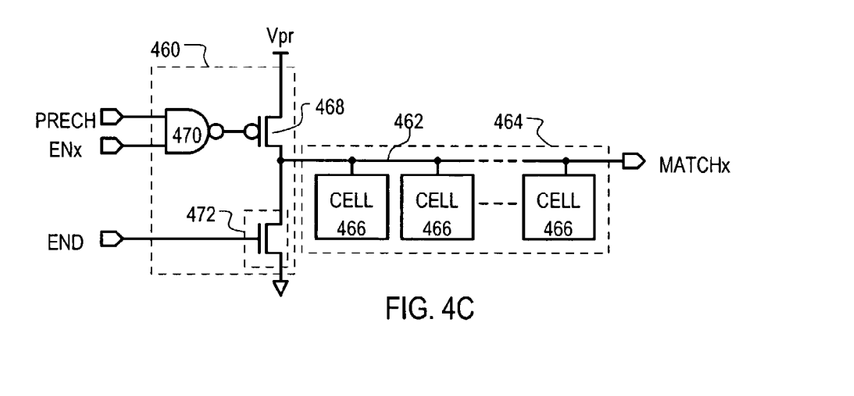

Referring now to FIGS. 4A to 4C examples of portions of a match circuit are shown in block schematic diagrams. FIG. 4A shows a match circuit portion 400 that may include a gate circuit 402 that may be enabled according to an enable signal ENx. When enabled, a gate circuit 402 may allow a key value KEY(IN) to be applied as a key output key value KEY(OUT). An input key value KEY(IN) may be received on an input key bus 404. An output key value KEY(OUT) may be provided on output key lines 406. Output key lines 406 may be connected to a number of CAM entries.

An enable signal ENx can correspond to enable indications (EN0 or EN1) of FIG. 1 and/or output signal ENx shown in FIG. 3. A match circuit portion 400 may be included in a match circuit corresponding to a particular segment of CAM entries (such as those shown as 118 and 120 in FIG. 1).

A gate circuit 402 may thus allow or prevent a key from being applied to a segment (e.g., 114 and 116) according to whether a corresponding search target value TARGET matches one or more PI values for the segment, or in some variations, a global key value. By preventing the application of a key value, a search function may be selectively disabled from among multiple CAM entry segments.

Selectively disabling a search function may reduce power consumption in a CAM device. For example, a search function could include any of the following: amplification of a key signal, compare circuit activation within CAM cells, activation or de-activation of match indications, to name but a few examples. All of these operations may consume power. If, due to predetermined criteria, it is known that a segment of CAM entries can be excluded from a search operation, search operations within such segments may be disabled, as noted above, thus saving power.

Referring now to FIG. 4B, a second example of a match circuit portion is shown in a block schematic diagram, and designated by the general reference character 450. A match circuit portion 450 may include a precharge circuit 452 that can be enabled or disabled according to an enable input ENx.

As in the case of FIG. 4A, an enable signal ENx can correspond to enable indications (EN0 or EN1) of FIG. 1 and/or output signals ENx shown in FIG. 3. A match circuit portion 400 may be included in a match circuit corresponding to a particular segment of CAM entries (such as those shown as 118 and 120 in FIG. 1).

A precharge circuit 452 may be connected to a number of match lines 454. Each match line 454 can be connected to an entry within a CAM segment 456 and provide a match indication MATCH0 to MATCHn.

When enabled according to an enable signal ENx, a precharge circuit 452 may precharge match lines 454 to a predetermined state. When disabled according to an enable signal ENx, a compare line precharge circuit 452 may not precharge compare lines to a predetermined state.

Preventing a precharging of match lines can reduce power consumption. As but one very particular example, a search operation in a CAM segment can result in match lines 454 being discharged. If a subsequent search operation is enabled (e.g., ENx has one value), match lines 454 may be precharged to a predetermined state. However, if a subsequent search operation is not enabled (e.g., ENx has another value because a search target value does not match a PI value for the segment) match lines 454 may be not be precharged, thereby reducing power consumption.

In addition or alternatively, a match circuit portion 450 may include sense amplifiers 458 that can be enabled or disabled according to an enable input ENx. Sense amplifiers 458 can receive match indications (MATCH0 to MATCHn). When enabled, sense amplifiers 458 can amplify match indication (MATCH0 to MATCHn) to generate amplified match indications (MATCH0' to MATCHn'). However, if disabled, sense amplifiers 458 can prevent the generation of amplified match indications (MATCH0' to MATCHn'). For example, if sense amplifiers 458 are disabled, amplified match indications (MATCH0' to MATCHn') may all be inactive (e.g., low). A disabling of sense amplifiers 458 may thus also reduce power consumption in a CAM device.

Referring now to FIG. 4C, one very particular example of a precharge circuit is set forth in a schematic diagram and designated by the reference character 460. A precharge circuit 460 may be connected to a match line 462 associated with a CAM entry 464. A CAM entry 464 may include a number of CAM cells 466 commonly connected to a match line 462.

A precharge circuit 460 may include a precharge device 468, precharge logic 470 and a discharge device 472. A precharge device 468, when enabled, can provide a low impedance path between a match line 464 and a precharge potential Vpr. Precharge logic 470 may selectively enable a precharge device 468 according to an enable signal ENx. In the particular case of FIG. 4C, if an enable signal ENx is active (high in this example), precharge logic 470 may allow precharge device 468 to be enabled according to a precharge signal PRECH. Conversely, if an enable signal ENx is inactive (low in this example), precharge logic 470 can be prevented from enabling precharge device 468, regardless of the value of a precharge signal PRECH.

FIG. 4C also shows a discharge device 472. A discharge device 472 may discharge a match line 464 at an end of a search operation. In FIG. 4C, an end cycle signal END can be activated (driven high in this case) at the end of a search operation.

In this way, one or more selected functions within a CAM segment may be enabled when a search target value matches a PI value. As a result, operations within a particular segment or a sub-block that corresponds to a matched search target value may be enabled.

Thus, unlike a conventional CAM device that may apply a key value, enable effectively all sense amplifiers and/or precharge lines in each search operation, embodiments of the present invention allow power consumption to be reduced by disabling any or all these functions in CAM segments excluded from a search operation according a target value comparison.

Figure 5:
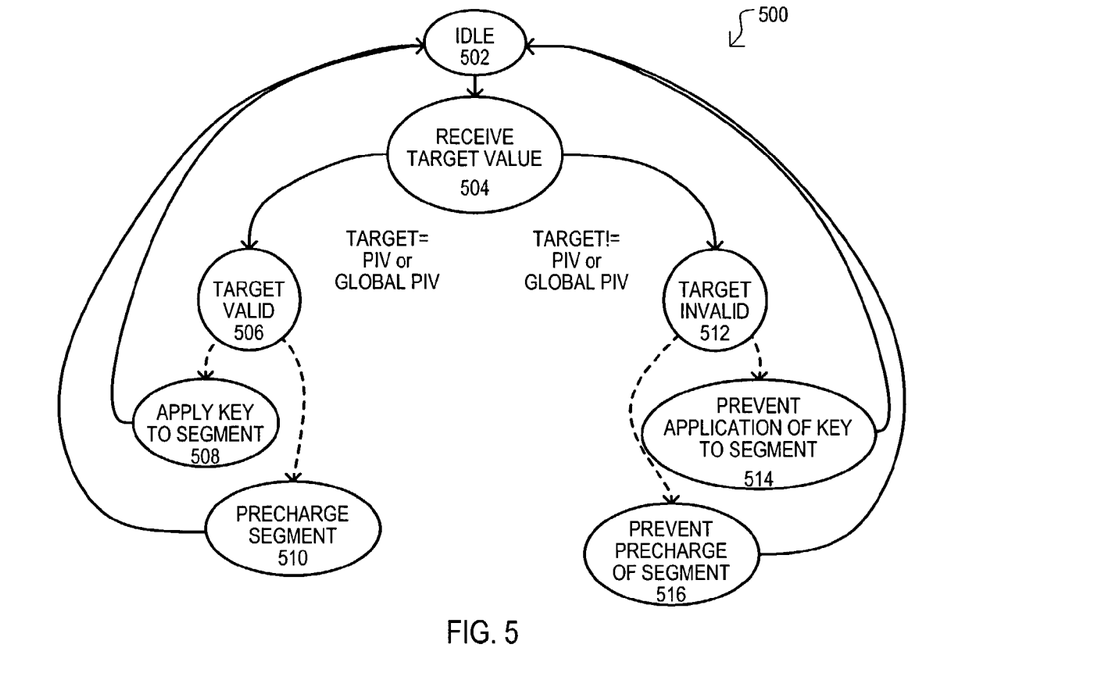
FIG. 5 is state diagram showing a CAM search method and apparatus according to one embodiment of the present invention.

Referring now to FIG. 5, a state diagram illustrating a search target compare method and apparatus is set forth and designated by the general reference character 500. A state diagram may move from an idle state 502 to a receive target value state 504. A state 504 may be entered upon a CAM device receiving a search command with an accompanying target value. As but one example, a CAM device may receive predetermined input signals that indicate a search operation and one or more predetermined data fields that store a search target value. Even more particularly, a search command may be generated by decoding a command field in a search request packet, where such a search request packet also includes a target value field.

In the event a target value matches a PI value (PIV) or global key value (GLOBAL PIV), a target value can be considered valid 506. A state 506 may be arrived at by applying a received target value to a comparator circuit, or the like, for comparison with one or more predetermined PI values and/or one or more predetermined global key values.

Various search functions may be executed in the event a target value is valid. FIG. 5 shows but two examples: applying a key value to a segment 508 and precharging a segment 510. Applying a key value 508 can include allowing a search key to be applied to a CAM segment (e.g., a predetermined portion of a CAM entries that is less than all the CAM entries on a CAM device) to thereby generate a search result. A key value may be received with a search command and/or a target value. Preferably, a search command and corresponding target value and key value can be included in a same search request packet.

Precharging a segment 510 may include allowing various predetermined lines within a CAM segment to be set to a predetermined potential. As but a few of the many possible examples, match lines may be set to a potential (e.g., a high potential at or about a high supply potential), bit lines and/or comparand lines and/or sense amplifiers nodes may be set to a same or different potential (e.g., precharged to a high, low or intermediate potential with respect to a high supply potential).

Of course, the particular states 508 and 510 shown in FIG. 5 are but examples of possible "enabling" states that can allow operations to proceed in the event of a target value match, and should not necessarily be construed as limiting the invention thereto. One or both of such states (508 and/or 510) may be arrived at following a valid target 506. Further, while search enabling states are shown, enabling states may also be arrived at related to different operations, such as read or write, to name but two examples.

In the event a target value does not match a PI value or global key value, a target value can be considered invalid 512. A state 512, like state 506, may be arrived at by applying a received target value to a comparator circuit, or the like, for comparison with one or more predetermined PI values and/or one or more predetermined global key values.

Search functions may be prevented in the event a target value is not valid. FIG. 5 shows but two examples: preventing the application of a key value to a segment 512 and preventing a precharging of a segment 514. A state 512 can include preventing key application as described with respect to state 508. Similarly, a state 514 can include preventing one or more of the various precharge functions described with reference to state 510.

The above embodiments have thus described methods that can be conceptualized as restricting a search space of a CAM device. Conventionally, a CAM device may be considered unrestricted, as all entries may be included in a search operation. In contrast, the present invention may include a method that limits a search space, by selectively enabling search operations to occur in only subsets of an entire search space according to PI values.

The above embodiments also show methods that can reduce the power consumption in a CAM. By restricting particular operations to only portions of a CAM device, power may be reduced as non-accessed portions may consume less power that accessed portions.

Figure 6A:
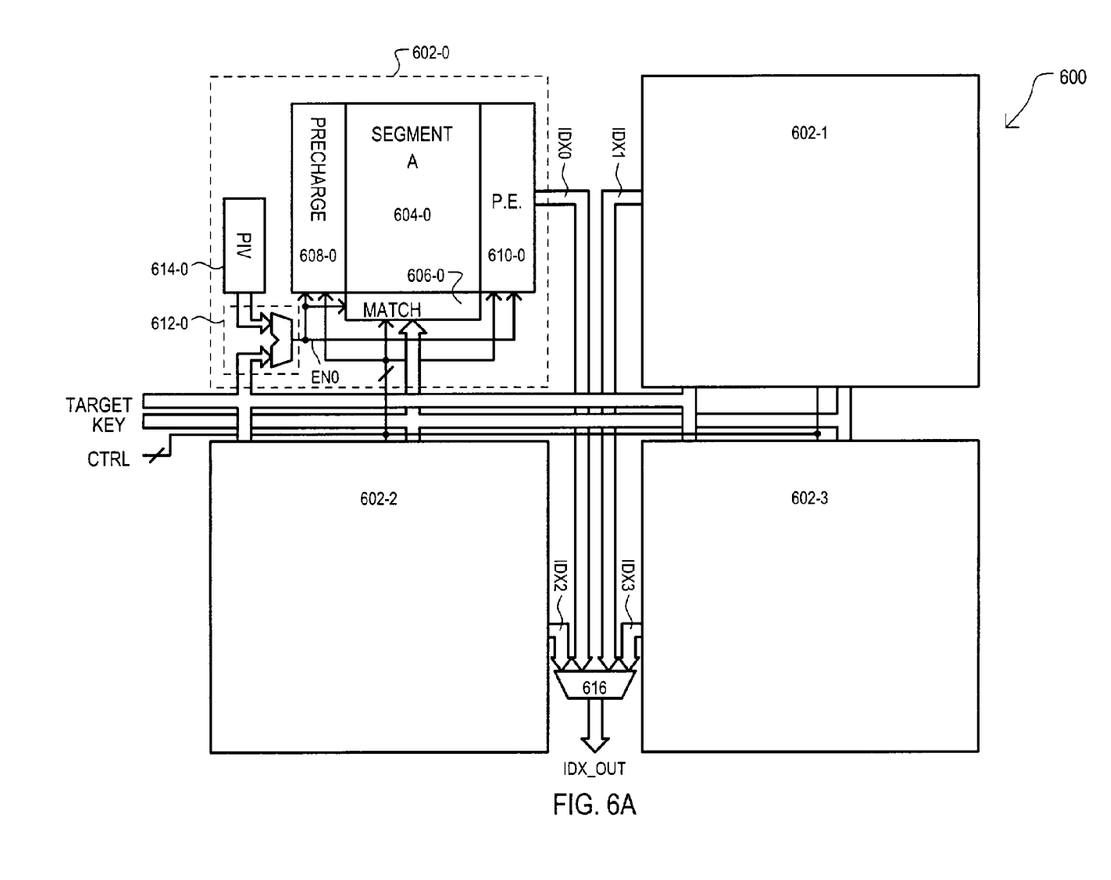
FIGS. 6A and 6B are top plan views showing top plan views of CAM devices according to embodiments of the present invention.

Referring now to FIG. 6A, one example of a CAM device is set forth in a plan view and designated by the general reference character 600. A CAM device 600 may include a number of sections 602-0 to 602-3. Each section (602-0 to 602-3) can have essentially the same structure, thus details of only one section 602-0 are shown in FIG. 6A.

In FIG. 6A, a section 602-0 may include a segment of CAM entries 604-0, a corresponding match circuit 606-0, one or more precharge circuits 608-0, a priority encoder 610-0, a local compare circuit 612-0, and a PIV store circuit 614-0. A match circuit 606-0 may receive a key value KEY and can be connected to a segment of CAM entries 604-0. A match circuit 606-0 can enable or disable a match between a key value KEY and entries of segment 604-0. A precharge circuit 608-0 may precharge various circuits related to entries of CAM segments 604-0. A priority encoder 610-0 can receive match indications corresponding to CAM entries segment 604-0. A priority encoder 610-0 can provide an output value corresponding to a highest priority match indication. In the particular example of FIG. 6A, a priority encoder 610-0 may output an index value IDX0.

A local compare circuit 612-0 can compare one or more PI values, and/or a global key value with a target value TARGET. PI values or global key values may be provided by a PIV store circuit 614-0.

A match circuit 606-0, precharge circuit 608-0 and/or priority encoder 610-0 may operate in response to control signals CTRL. In addition, a match circuit 606-0, precharge circuit 608-0 and/or priority encoder 610-0 can be enabled or disabled according to an enable signal EN0 provided by local compare circuit 612-0.

In the case of FIG. 6A, each section (602-0 to 602-3) may receive a target value TARGET, a key value KEY and control signals CTRL, and provide an output value IDX0 to IDX3.

In operation, a CAM device 600 may receive a search command along with a target value TARGET. Local compare circuits (such as 612-0) may compare a target value TARGET with one or more PI and/or global key values of a corresponding PIV storage circuit (such as 614-0). A result of such a comparison (e.g., EN0) can enable or disable a corresponding precharge circuit and/or match circuit and/or priority encoder (e.g., 606-0, 608-0, 610-0).

Upon receiving a search command a CAM device 600 may also activate predetermined control signals CTRL that may result in the application of a key value KEY to sections (602-0 to 602-3). However, only those sections (602-0 to 602-3) having circuits enabled by a match comparison can perform a search operation, and generate an index value (IDX0 to IDX3).

In the particular example of FIG. 6A, one index value from multiple such index values (IDX0 to IDX3) may be selected as an output index value IDX_OUT. A selection circuit 616 may select one index value (IDX0 to IDX3) according to predetermined criteria. As but one example, each index value may include one or more priority values that can determine selection of an output index value IDX_OUT.

In this way, a CAM device 600 may include multiple sections (602-0 to 602-3) each of which can include a local compare circuit (e.g., 612-0) that can generate a local enable signal for a corresponding section (602-0 to 602-3).

Figure 6B:
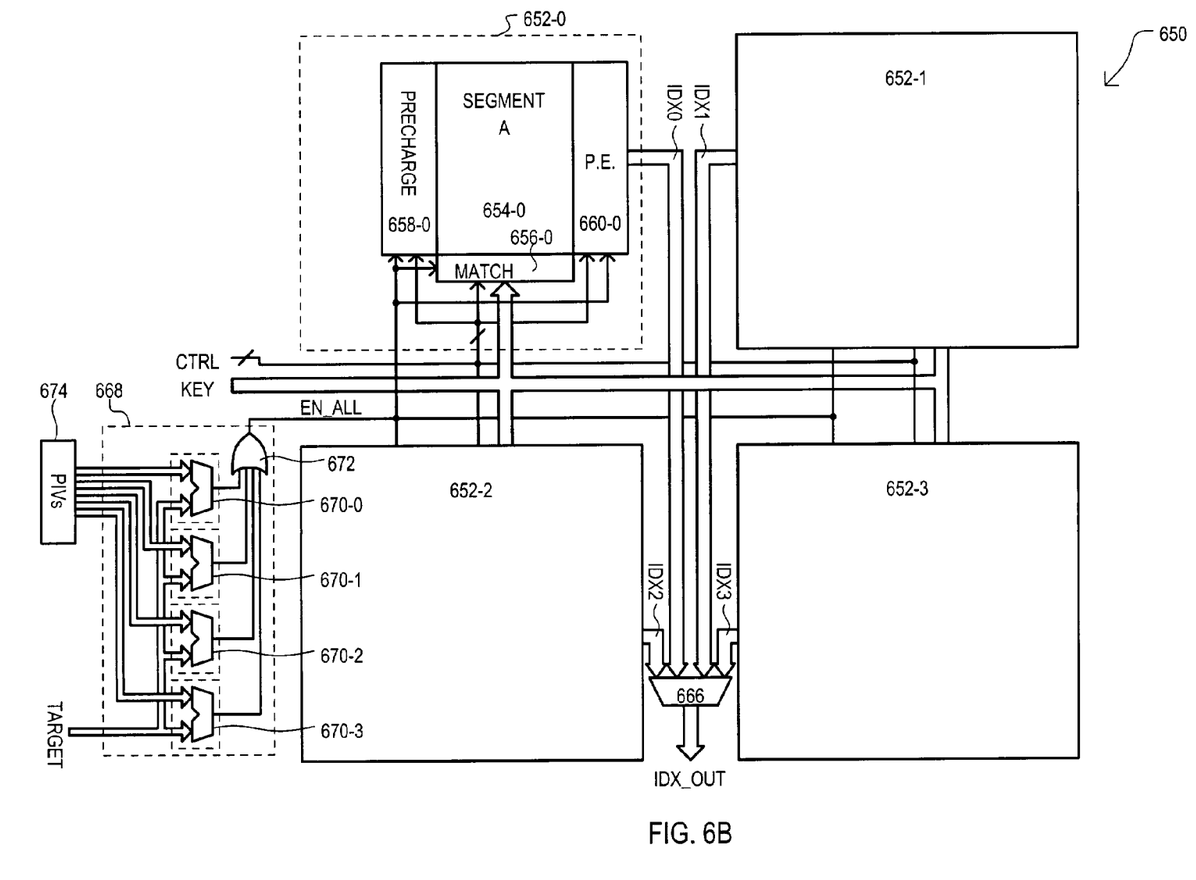

Referring now to FIG. 6B, a second example of a CAM device is set forth in a plan view and designated by the general reference character 650. Like the arrangement of FIG. 6A, a CAM device 650 may include a number of sections 652-0 to 652-3, each having essentially the same structure. Thus, only the details of section 652-0 are shown in FIG. 6B.

In FIG. 6B a section 652-0 may include a segment of CAM entries 654-0, a corresponding match circuit 656-0, one or more precharge circuits 658-0, and a priority encoder 660-0.

Unlike CAM device 600 of FIG. 6A, a CAM device 650 may include a common compare circuit 668, rather than local compare circuits associated with each section. A common compare circuit 668 may receive multiple PI values and compare such PI values to a target value TARGET. In the particular example of FIG. 6B, if any of the PI values matches a target value TARGET, an enable signal EN_ALL can be activated. If none of the PI values matches a target value TARGET, an enable signal EN_ALL can be activated.

The particular common compare circuit 668 of FIG. 6B includes a number of comparators (670-0 to 670-3). Each comparator (670-0 to 670-3) can compare a PI value to a target value TARGET. Comparison results for comparators (670-0 to 670-3) may be logically combined within a common compare circuit 668. In the particular arrangement of FIG. 6B, results of comparators (670-0 to 670-3) can be logically ORed in an OR gate 672. In this way, if any PI value provided by a PIV store 674 matches a target value TARGET, an enable signal EN_ALL can be active.

PI values may be supplied to comparators (670-0 to 670-3) from a PIV store 674. In one approach, at least one PI value may correspond to a particular section (652-0 to 652-3). Preferably, one PI value can correspond to each section (652-0 to 652-3). In the very particular example of FIG. 6B, PIV store 674 may provide PI values to each comparator (670-0 to 670-3) from different storage locations. That is, each such PI value provided by PIV store 674 can correspond to a particular section (652-0 to 652-3).

An enable signal EN_ALL generated by a common compare circuit 668 can be supplied to each section (652-0 to 652-3) and enable or disable the operation of predetermined circuits within each section (652-0 to 652-3). In the particular example of FIG. 6B, an enable signal EN_ALL can be supplied to match circuits (e.g., 656-0), precharge circuits (e.g., 658-0), and priority encoders (e.g., 660-0) within each section (652-0 to 652-3).

Thus, unlike the CAM device of FIG. 6A, in the CAM device of FIG. 6B, all sections (652-0 to 652-3) of a CAM device 650 may be enabled when any of a number of PI values matches a target value TARGET, or may be disabled when none of the PI values matches a target value TARGET.

Figure 7:
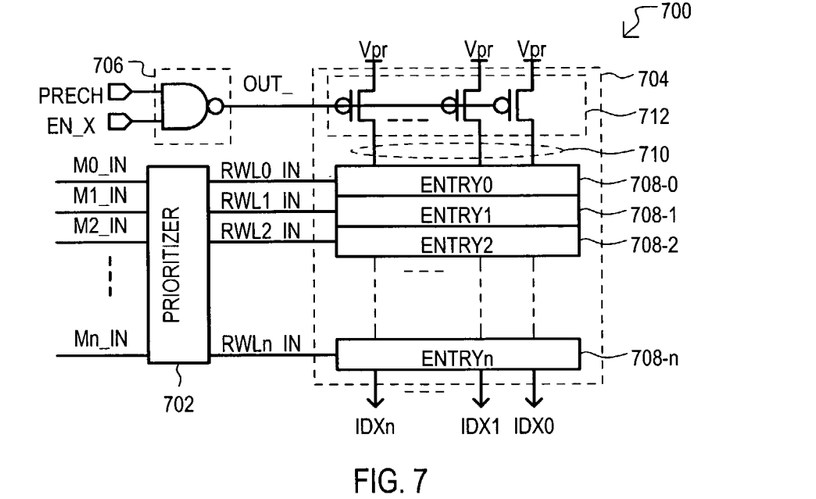
FIG. 7 is block schematic diagram of a priority encoder that may be used in embodiments of the present invention.

Referring now to FIG. 7, one example of a priority encoder according to an embodiment is set forth in a block schematic diagram, and designated by the general reference character 700. A priority encoder 700 may include a prioritizer circuit 702, an encoding read-only-memory (ROM) 704, and a control circuit 706. A prioritizer circuit 702 may receive multiple match indications M0_IN to Mn_IN. Match indications (M0_IN to Mn_IN) may each correspond to a CAM entry. If a data value within a CAM entry matches an applied key value, a match indication may be activated (e.g., be high). A prioritizer circuit 702 may prioritize from among multiple active match indications. As but one example, such a prioritization may be based on a physical address.

An encoding ROM 704 can include a number of entries 708-0 to 708-n, each connected to a number of index lines 710. Index lines 710 may provide index values (IDX0 to IDXn) that reflect an encoded indication of a highest priority match indication. Index lines 710 may be precharged by a precharge circuit 712. A precharge circuit 712 can include a number of precharge devices that may connect index lines 710 to a precharge potential Vpr. A precharge potential Vpr may be a power supply voltage, or the like. In the arrangement of FIG. 7, precharge devices can include p-channel insulated gate field effect transistors that can be commonly enabled in response to an output signal OUT_from a control circuit 706.

A control circuit 706 can receive an enabling signal EN_X and a control signal PRECH. If an enable signal EN_X is active (in this example, high), an output signal OUT_can vary according to a control signal PRECH. However, if an enable signal EN_X is not active (in this example, low) an output signal OUT_can be forced inactive (high in this case).

In one approach, a control circuit 706 may include a circuit that performs an AND-like operation on a control signal PRECH and enable signal EN_X. In the particular case of FIG. 7, a control circuit 706 may include a NAND gate.

In this way, a priority decoder 700 may be enabled or disabled according to an enable signal EN_X, that can be provided by comparing one or more PI values with an applied target value. Of course, FIG. 7 represents but one approach to disabling a priority encoder. Alternate approaches could be employed.

Figure 8:
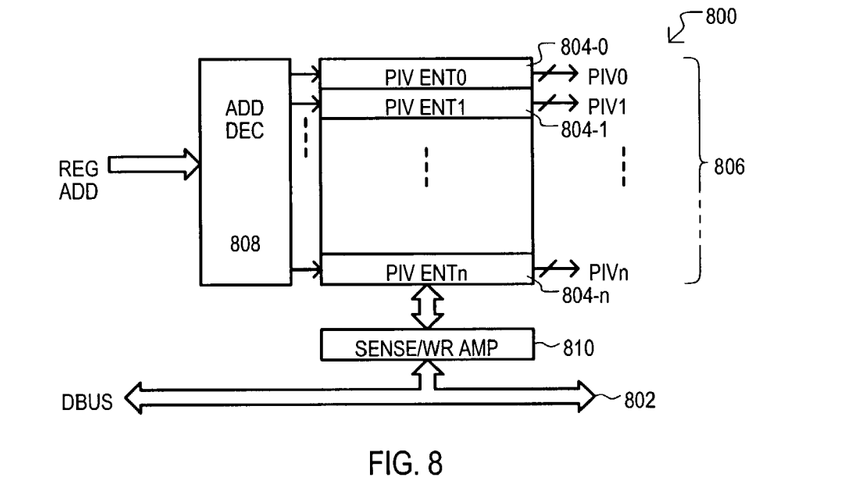
FIG. 8 is a block schematic diagram of a programmable information value store according to an embodiment of the present invention.

Referring now to FIG. 8, an example of a PIV store according to one embodiment is set forth and designated by the general reference number 800. A PIV store 800 may be a programmable information register. PI data values may be received on a data bus 802 and stored within register entries 804-0 to 804-n. Register entries (804-0 to 804-n) may output stored PI values (PIV0 to PIVn) at PIV outputs 806.

In the very particular example shown in FIG. 8, register entries (804-0 to 804-n) may be accessed according to a register address REG ADD, which can be decoded by an address decoder 808. Thus, a CAM device may include a register "space" (a number of registers accessible according to a register address), at least a portion of which can store PI values (and/or global key values) that may each correspond to a particular collection of CAM entries.

The example of FIG. 8 can also include an amplifier block 810. An amplifier block 810 may include sense amplifiers for amplifying a PI value (PIV0 to PIVn) read from a register entry (804-0 to 804-n). In addition or alternatively, an amplifier block 810 may include write amplifiers for amplifying a PI value (PIV0 to PIVn) that is written into a register entry (804-0 to 804-n).

Of course, while the example of FIG. 8 shows an example of a PIV store 800 having register entries (804-0 to 804-n) that can have two different output paths (e.g., register outputs 806 and data bus 802), a PIV store may provide one such output path.

Figure 9:
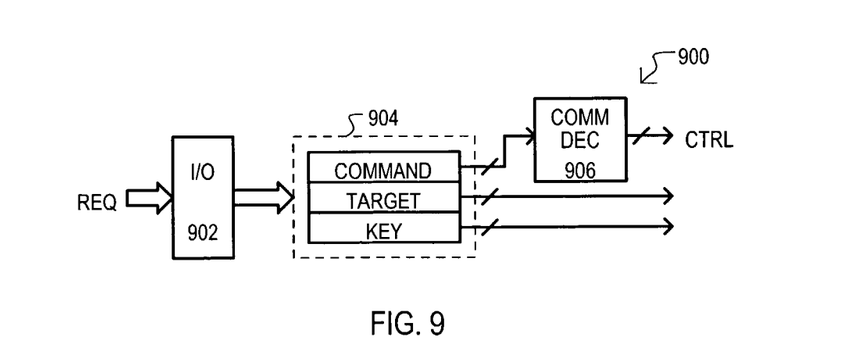
FIG. 9 is a block schematic diagram of a CAM input device according to an embodiment.

Referring now to FIG. 9, an example of a CAM device input path according to one embodiment is set forth in a block diagram, and designated by the general reference character 900. An input path 900 may include input/output (I/O) circuits 902, a request store 904, and a command decoder 906. I/O circuits 902 can receive a request REQ and store such a request into a request store 904. I/O circuits 902 may take a variety of forms. In one approach, I/O circuits 902 may receive a request having various predetermined data fields, preferably a request having at least a command field, target value field, and key field. Even more preferably, an I/O circuit 902 may include de-packetizing circuits that "de-packetize" a request in packet form, extracting at least a command field, target field, and key field.

A request store 904 may store at least a command data value COMMAND and a target value data TARGET. In the case of a search command, a key data value KEY can also be stored. Such data may then be provided to different parts of a CAM device. For example, command data COMMAND may be provided to a command decoder 906. A command decoder 906 may decode command data into control signals CTRL, which may activate predetermined CAM device circuits.

Target data TARGET may be provided to compare circuits, like those described above, for comparison with PI (and/or global key) values, or the like.

Key data KEY may be provided to CAM entries, or the like, for comparison with stored data values. In addition or alternatively, key values may be stored in a predetermined register.

It is noted that while a CAM device according to the present invention may take a variety of forms, a CAM device may preferably be formed in a single semiconductor substrate, thus providing a fast self-contained search engine device. Each such search engine device may receive a common command, and provide selectable access to internal portions according to a target value associated with such a command.

Selectable access to a CAM may also allow for more flexible arrangement of data within a CAM device. For example, a CAM may initially have "empty" segments. Operations for such empty segments may be precluded from operations by setting non-matching PI values for such segments. As a number of CAM entries grows, data values may be stored within such segments, and PI values changed to enable access to such segments. This is in contrast to conventional approaches that may block move data values within a single undivided group of entries.

Of course, while embodiments set forth herein have been described in detail, it should be understood that the present invention could be subject to various changes, substitutions, and alterations without departing from the spirit and scope of the invention. Accordingly, the present invention is intended to be limited only as defined by the appended claims.

What is claimed is:

1. A content addressable memory (CAM) device, comprising:
   a programmable information value store for storing a plurality of programmable information (PI) values, at least two PI values being associated with each of a plurality of collections of CAM entries and enabling operations for the associated collection of CAM entries;
   a plurality of search circuits, each search circuit being associated with a collection of CAM entries and being disabled in response to a corresponding enable signal; and
   a plurality of comparator circuits, a comparator circuit corresponding to each collection of CAM entries, each comparator circuit activating the corresponding enable signal in response to a comparison between a target value provided with, and separate from, a search key value and the at least two PI values associated with the collection of CAM entries corresponding to the comparator circuit.

2. The CAM device of claim 1, wherein:
   the programmable information value store includes a number of register entries, each register entry storing at least one of the PI values.

3. The CAM device of claim 2, wherein:
   each register entry is accessible by a predetermined register address.

4. The CAM device of claim 2, further including:
   a data bus coupled to the programmable information value store for accessing PI values.

5. The CAM device of claim 1, wherein:
   each comparator circuit includes a plurality of comparators, each comparator corresponding to at least one PI value, and having a first input that receives a search target value and a second input that receives the at least one PI value.

6. The CAM device of claim 5, wherein:
   each comparator circuit further includes a logic circuit for logically combining the outputs of each comparator.

7. The CAM device of claim 1, wherein:
   each collection of CAM entries is commonly coupled to at least one key bus that provides a key value for comparison to data values stored in the collection of CAM entries.

8. A method of searching a CAM device, comprising the steps of:
   enabling a search of at least one portion of a CAM cell array, but less than all portions of the CAM cell array, if any of a plurality of programmable information (PI) values associated with the at least one portion of the CAM cell array matches a target value supplied with and different than a search command; and
   enabling a search of all portions of the CAM cell array if a global key value matches the target value regardless of whether different portions of the CAM cell array have different associated PI values by comparing the global key value to the target value in an operation separate from that which compares the PI values to the target value.

9. The method of claim 8, further including:
   comparing a plurality of PI values to the target value.

10. The method of claim 8, further including:
    decoding the search command to generate a plurality of control signals.

11. The method of claim 8, further including:
    disabling the search of at least one portion of a CAM cell array if a PI value associated with the at least one portion of the CAM cell array does not match the target value.

12. The method of claim 11, wherein:
    disabling the search of at least one portion of the CAM array includes preventing a charging or discharging of selected portions of circuits associated with the at least one portion of the CAM array.

* * * * *